(12) United States Patent
Simko et al.

(10) Patent No.: US 12,712,360 B1
(45) Date of Patent: Aug. 18, 2026

(54) PREDICTIVE CONTROL SYSTEM FOR ELECTRICAL ENERGY GRIDS

(71) Applicant: Curv Energy, Inc., McLean, VA (US)

(72) Inventors: Peter Simko, Bratislava (SK); Peter Laurinec, Svedernik (SK)

(73) Assignee: PowereX j.s.a., Bratislava (SK)

( * ) Notice: Subject to any disclaimer, the term of this patent is extended or adjusted under 35 U.S.C. 154(b) by 689 days.

(21) Appl. No.: 18/080,724

(22) Filed: Dec. 13, 2022

Related U.S. Application Data

(60) Provisional application No. 63/293,036, filed on Dec. 22, 2021.

(51) Int. Cl.

| | |
|---|---|
| ***H02J 3/001*** | (2026.01) |
| ***G01R 19/25*** | (2006.01) |
| ***G05F 1/66*** | (2006.01) |
| ***H02J 3/00*** | (2026.01) |
| ***H02J 3/38*** | (2026.01) |

(52) U.S. Cl.
CPC .......... *H02J 3/001* (2020.01); *G01R 19/2513* (2013.01); *G05F 1/66* (2013.01); *H02J 3/003* (2020.01); *H02J 3/004* (2020.01); *H02J 3/38* (2013.01)

(58) Field of Classification Search
CPC .. H02J 3/001; H02J 3/003; H02J 3/004; H02J 3/38
See application file for complete search history.

(56) References Cited

U.S. PATENT DOCUMENTS

| | | | | |
|---|---|---|---|---|
| 9,960,637 | B2 | 5/2018 | Sanders et al. | |
| 10,938,236 | B2 | 3/2021 | Forbes, Jr. | |
| 10,985,572 | B2 | 4/2021 | Duan et al. | |
| 2003/0014465 | A1 | 1/2003 | Mugica et al. | |
| 2011/0231028 | A1* | 9/2011 | Ozog | H02J 3/14 700/291 |
| 2012/0065792 | A1* | 3/2012 | Yonezawa | H02J 3/003 700/291 |
| 2013/0046413 | A1 | 2/2013 | Ellis | |
| 2013/0289772 | A1 | 10/2013 | Friedrich et al. | |
| 2013/0311000 | A1 | 11/2013 | Kudo et al. | |
| 2015/0248118 | A1 | 9/2015 | Li et al. | |
| 2020/0006944 | A1* | 1/2020 | Fife | H02J 3/004 |
| 2022/0263312 | A1* | 8/2022 | Tsujii | H02J 3/004 |
| 2023/0288492 | A1* | 9/2023 | Hiroe | G01R 31/40 |

* cited by examiner

*Primary Examiner* — Mohammad Ali
*Assistant Examiner* — Dhruvkumar Patel
(74) *Attorney, Agent, or Firm* — Nixon & Vanderhye P.C.

(57) ABSTRACT

Automatically managing surplus and deficiencies on an electrical distribution network comprises sending and receiving information from a connected control point of a computer-based grid controller, and operating the control point, including: monitoring the energy surplus and deficiency state of the electrical distribution network to predict the energy surplus and deficiencies on the electrical distribution network. Locally trained machine learning models are run against collected data corresponding to an electrical distribution network to generate predictions of energy consumption and generation at one or more sites that each include at least one locally controlled energy management system.

21 Claims, 7 Drawing Sheets

Edge Distributed AI EMS
CURV Energy
C01

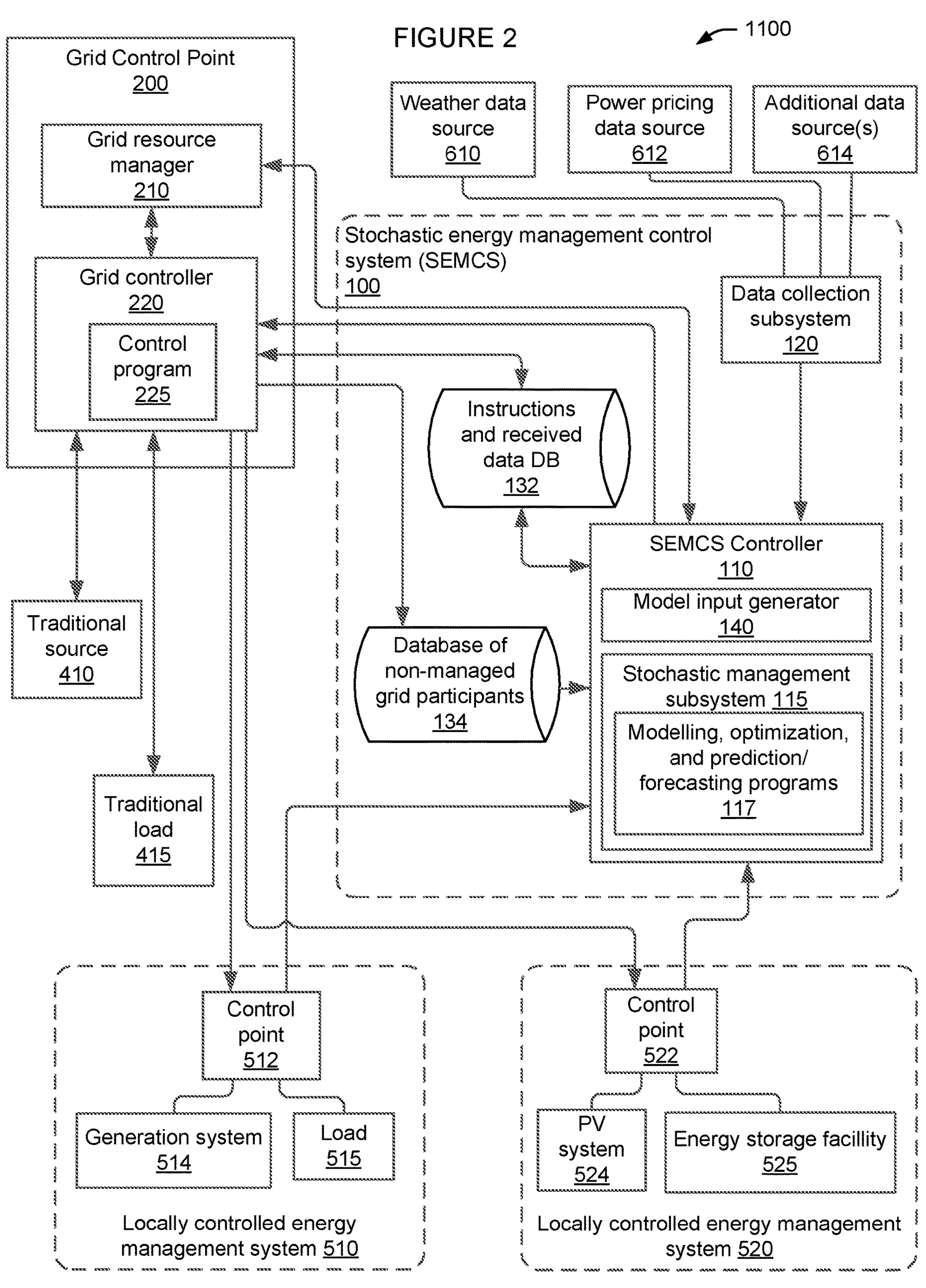
FIGURE 2
1100
Grid Control Point 200
Grid resource manager 210
Grid controller 220
Control program 225
Weather data source 610
Power pricing data source 612
Additional data source(s) 614
Stochastic energy management control system (SEMCS) 100
Data collection subsystem 120
Instructions and received data DB 132
SEMCS Controller 110
Model input generator 140
Stochastic management subsystem 115
Modelling, optimization, and prediction/ forecasting programs 117
Database of non-managed grid participants 134
Traditional source 410
Traditional load 415
Control point 512
Generation system 514
Load 515
Locally controlled energy management system 510
Control point 522
PV system 524
Energy storage facillity 525
Locally controlled energy management system 520

Energy Surplus or Deficiency Management

Global Optimization

Compliance Prediction

PREDICTIVE CONTROL SYSTEM FOR ELECTRICAL ENERGY GRIDS

1 CROSS REFERENCE TO RELATED APPLICATION

This application claims priority from U.S. provisional patent application No. 63/293,036 filed Dec. 22, 2021, incorporated herein by reference for all purposes as if expressly set forth.

2 COPYRIGHT NOTICE

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: Copyright © 2021, Curv Energy Inc. & PowereX jsa.

3 BACKGROUND OF THE TECHNOLOGY

3.1 Field

The exemplary, illustrative, technology herein relates to systems, software, and methods for controlling power distribution, and more particularly a predictive control system for electrical energy grids.

3.2 Related Art

Locally controlled energy management systems for grid connected facilities are proliferating based upon the benefits they provide to the individual grid participants. The locally controlled energy management systems increase the variability of the load and generation of these facilities. New energy management systems supporting grid participants that optimize the operation of each grid participant with respect to operating conditions and cost of grid power. These systems directly manage the energy generation, load management, storage, and combined generation+storage+load characteristics of each grid participant, each of the new systems further changing the nature of the grid behavior in unpredictable ways. The unpredictability is caused by each locally controlled energy management system making localized energy management decisions optimized for the individual grid participant with which the energy management system operates on behalf of, without regard to the knock-on effects of these decisions upon the overall energy delivery grid. A grid operator, which is tasked with balancing the power input and draws from the grid as a whole, does not have visibility into the inputs used for each local energy management system decisions nor the specific algorithms for optimization used by these systems. This lack of information makes decisions of the grid operator that are intended to balance the electrical grid generation and usage capacities increasing complex. Furthermore, these decisions lag the implementation of the decisions by the local energy management systems, resulting in a feedback loop that is constantly lagging actual performance. Hierarchical energy management systems have also demonstrated weaknesses and flaws in its implementation over the years.

Locally controlled energy management systems range from smart thermostats and home controllers for residential properties, including photovoltaic (PV) controllers that determine the amount of solar, grid, and battery power to utilize, through improved building management and factory power management systems that consider many additional factors in their energy management optimizations. In addition, generation and co-generation facilities determine when and how they provide power to the grid under their own local control systems that optimize revenue for the facility.

Unlike earlier locally controlled energy management systems, these systems utilize information from a plurality of sources, including energy pricing, locally available storage capacity, generation capacity/cost, local area (localized) energy usage (demand and response values), current and projected energy imbalance (difference between forecast demand/production, actual demand/production), current and projected energy flows at interconnection points, and even information from external sources such as the current and forecast weather. They use this information to optimize the facility's energy consumption and generation and to make local energy usage and/or generation control decisions on behalf of facility owners. This makes the grid capacity management challenge for grid operators even more complex.

Older control models were designed for generation capacity and loads that were relatively fixed and that were assumed to comply with grid operator instructions (analogous to the energy conservation programs that command the disabling of loads during periods of high utilization). These older control models no longer produce predictable results for management of the grid. They fail because the older control models are unable to account for fluctuations in utilization and supply created by the real time decisions of locally controlled energy management systems. New systems that are adapted to recognize this change in control paradigms are needed.

In the past, grid operators have been limited in the types of control they can assert over individual control points and unconnected users. Control strategies implemented by grid operators have been limited to encouraging specific facility behavior (historically, conservation and curtailment loads) by managing tariff pricing to reward desired behaviors and informing stakeholders of desired behaviors that will keep the grid balanced. In some cases, a grid operator may reach agreements with one or more classes of users to permit the on-demand curtailment of loads in return for an economic incentive (e.g., load shed or demand response agreements that offer users incentives that can include lower power rates or a pricing rebate on a power bill during certain months). While the levels and types of control that grid operators exercise may not change, grid resource managers need to be able to make better and more informed decisions based upon accurate predictions of stakeholder participation and response to grid operator demand and generation management requests.

Further complicating the management issues, some grid participants now may provide both load and supply at varying times as local storage operators that arbitrage the differences in power costs on the grid at different times of the day. Grid operators may be obligated to accept certain locally controlled supply and/or load constraints which result in wild swings in available power on the grid and energy pricing. The grid energy management system must be able to account for these participants and account for their changing nature.

4 SUMMARY OF THE TECHNOLOGY

In one embodiment, a system and method for automatically managing surplus and deficiencies on an electrical distribution network comprises sending and receiving information from a connected control point of a computer-based grid controller, and operating the control point, including: monitoring the energy surplus and deficiency state of the electrical distribution network to predict the energy surplus and deficiencies on the electrical distribution network, selecting a set of electrical controllers to manage the energy surplus/deficiency with, and generating instructions to change the energy usage/generation controlled by one or more electrical controllers, the instructions configured to cause the electrical controller to either provide additional electrical energy to the distribution network, or to cause the electrical controller to curtail electrical energy load on the distribution network, monitor the energy usage/generation of the instructed electrical controller(s) to determine the actual electrical energy used/generated for a defined period of time, and/or generate additional instructions to change the energy usage/generation controlled by one or more electrical controllers.

The system or method may predict the contribution controlled by each electrical controller to the electrical distribution network.

The system or method may further include predicting the compliance in response of an electrical controller to an instruction from the grid controller.

The system or method may further include providing the additional instructions to a different set of electrical controllers than the originally selected set of electrical controllers.

The system or method may further include providing the additional instructions to the set of electrical controllers that did not comply with the initial instructions.

The defined period of time may be less than 1 hour or preferably less than 15 minutes or preferably less than 5 minutes.

The prediction may be based in part upon extrinsic weather, market data, grid data or other information collected by the grid controller and/or based in part upon the performance by one or more electrical controllers in comparison to a previous prediction.

The system or method may further include predicting the compliance and finding optimal path to minimize cost of service being provided to stabilized distribution network in response of an electrical controller to an instruction from the grid controller.

The system or method may further include providing optimal utilization of individual assets to minimize incurred cost, and thereby providing space for lower costs of grid stabilization/resiliency.

These and other aspects and advantages will become apparent when the Description below is read in conjunction with the accompanying Drawings.

5 BRIEF DESCRIPTION OF THE DRAWINGS

The features of the present technology will best be understood from a detailed description of the technology and example embodiments thereof selected for the purposes of illustration and shown in the accompanying drawings in which:

FIG. 2 illustrates a second example grid energy management/control system architecture (1100).

6 DESCRIPTION OF SOME EMBODIMENTS OF THE TECHNOLOGY

6.1 Overview

Figure 1:
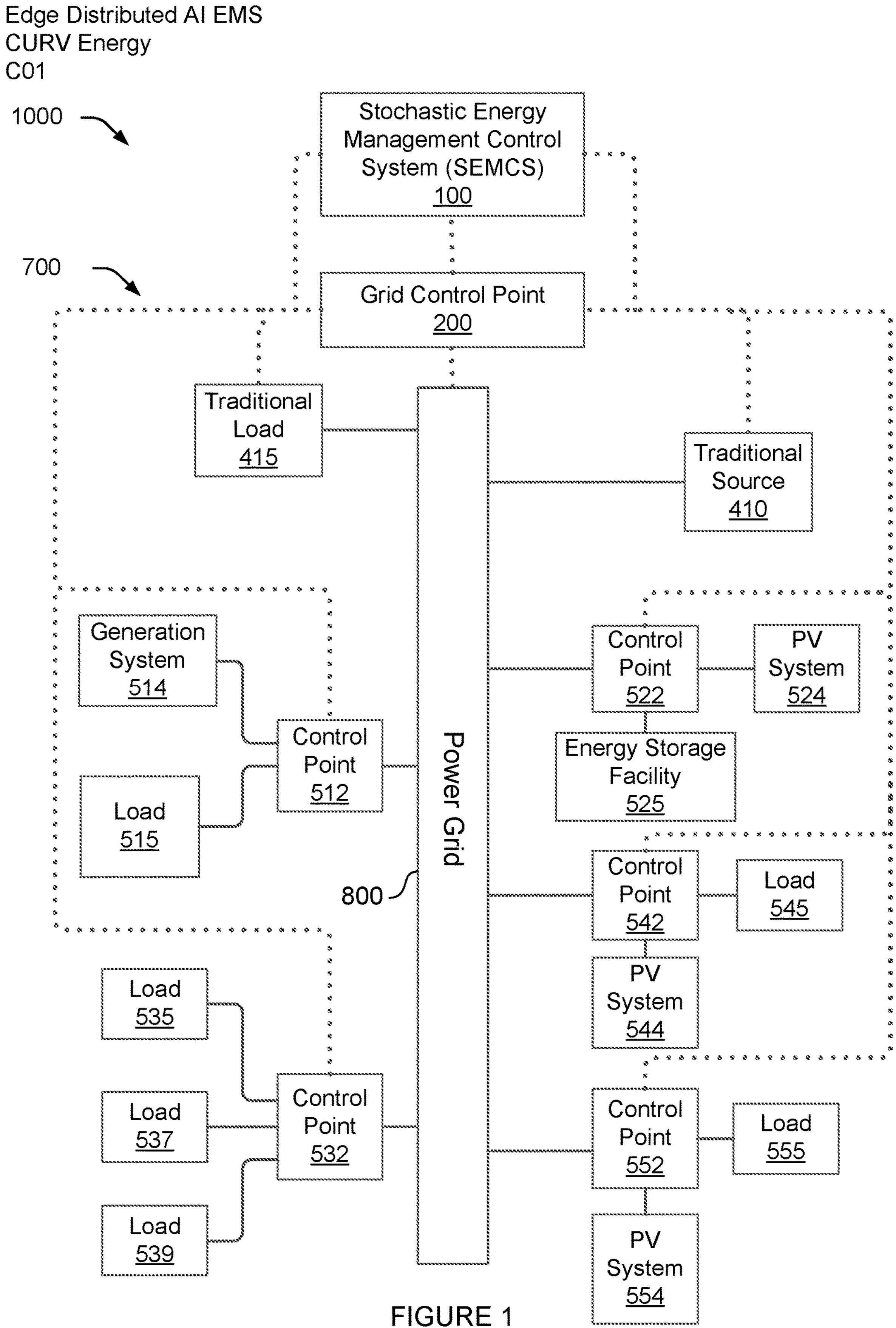
FIG. 1 illustrates a first example grid energy management/control system architecture (1000).

The described grid energy management and control system provides an energy management control system (SEMCS). The SEMCS is adapted for management of grids and microgrids that include one or more locally controlled energy management systems and corresponding control points/smart controllers. The described energy management control system features a SEMCS controller with machine learning capabilities (either distributed, consolidated, or hybrid) and predictive capabilities that enable the prediction of the behaviors of “smart loads”, “smart demand”, and “smart generation” control systems operably connected to the SEMCS controller. The SEMCS controller uses the machine learning capabilities to characterize the behaviors of one or more grid participants including those sources and loads controlled by “smart” control systems, and to predict their behaviors under varying operating conditions. The SEMCS controller further uses the machine learning capabilities and the predictions to determine instructions to be provided to the smart system controllers that control operations of these sources and loads in order to optimize their behaviors with respect to the overall grid performance.

Grid participants provide various load and generation capabilities to a grid, characterized by their energy use, generation, and response curves attributes. The SEMCS controller collects information about grid participant characteristics and behaviors, under varying conditions, individually and as members of classes and subclasses of participants, including locally controlled energy management systems and the loads and sources that they control, and predicts their behavior under various operating conditions. The SEMCS controller also provides instructions to these participants controlling one or more aspects of their power consumption and/or generation (or instructs an independent grid management system to provide specific instructions) for their optimized usage. A general term for a participants load and generation control systems that are operably connected to the SEMCS controller is “control point”. The SEMCS controller accounts for the changing nature of locally controlled energy management systems by providing grid resource managers with accurate predictions of their participation, compliance, and of their response to grid operator demand and generation management requests. The SEMCS controller further integrates dynamic, static and/or actual traditional loads and generation capacity with newer locally controlled energy management system supplies and loads. Dynamic load may change in time, while actual load can also represent base-load type of load (steady/ flat line). The grid resource managers are able to make better and more informed decisions based upon the information provided by the SEMCS controller.

Characteristics of various grid participants are listed below in Table 1.

TABLE 1

| Grid Stakeholders | | |
|---|---|---|
| | Characteristics | Controller, organization notes |
| 1 Local grid operator | | Local power company |
| 2 Grid coordinator/predictor (resource manager) | | CURV main controller |
| 3 Residential, unmanaged | | |
| 4 Residential, managed | "smart" control point | Smart home/facility controller |
| 5 Residential, partial renewable source | | Sells to grid under certain conditions, load varies based upon conditions. |
| 6 Residential load + EV | | Several subgroups. EV, w/ or w/o partial renewable source |
| 7 EV charging | | Several subgroups. w/ or w/o renewable source, e.g. chargepoint |
| 8 Commercial, unmanaged | | |
| 9 Commercial, managed | "smart" control point | Several subgroups, w/ or w/o renewable source |
| 10 Industrial, managed | "smart" control point | Typically under site management by a local controller |
| 11 Industrial, w/ co-generated/battery/diesel | | Typically under site management by a local controller |
| 12 Variable source | | e.g. wind, solar |
| 13 Variable storage/source | | e.g. battery, pumped hydro, TES |
| 14 Fast response source | | e.g. gas genset |
| 15 Slow response source | | e.g. legacy steam plant, nuclear plant |
| 16 Fast response load/source | | e.g. battery bank |
| 17 Slow response load/source | | |

In the described system, there are several actors including the grid controller, the grid resource manager (which operates one or more SEMCS controllers), and grid participants of the various types enumerated above. The grid resource manager provides predictive and analytical capabilities and, through the capabilities of the SEMCS controller(s), provides instructions to and monitoring of control points, and traditional and/or traditional loads, manages aspects of the grid and the behaviors of some of the grid participants.

Control points are smart locally controlled energy management systems (as described above) which include locally controlled "smart" system controllers. The locally controlled "smart" system controllers manage one or more aspects of generation and usage for the benefit of individual or groups of grid participants. Control point behaviors are subject to observation, characterization, and modelling/prediction by the SEMCS controller, either directly or indirectly. Control point behaviors may be controlled and/or optimized (at least in part) by the SEMCS controller. Additionally or alternatively, control point behaviors may be controlled and/or optimized by the grid controller, which may make control and/or optimization decisions based on information generated by the SEMCS controller.

Traditional and legacy loads and generation systems are energy loads and generation capacity that are not subject to management and optimization by the SEMCS controller (but may be observed, characterized, modelled, and/or predicted by the SEMCS controller). However, in one embodiment, the SEMCS controller may additionally implement a known strategy, such as triggering on-demand load curtailment of traditional loads, as part of an overall energy management plan that includes instructing a smart controller to make changes.

One of the challenges in managing the load on electrical grids (and microgrids) that include locally controlled "smart" control points, is that the control points operate for the benefit of a corresponding facility (e.g., control point) owner/operator and are optimized to maximize each facility owner/operator's return. Smart control points use differing information inputs, management strategies, and decision points as compared to older control systems in making their power usage/generation decisions. For example, smart control points can use inputs that include the instant price/cost of energy, the current solar radiation levels, and internal energy storage state in making their power usage/generation decisions.

For example, a smart control point associated with a facility (a home, an office building, or an industrial complex) may use current electrical usage of the facility and local generation in the form of PV panels that are generating power to determine whether the facility sells locally generated power to the grid operator or consumes electricity from the local power grid at any given instant. In addition, other factors such as whether the day is a holiday or weekend and current demand/supply levels also influence the usage/generation decision. Historically, smart control points were cost prohibitive for small users and were present only in commercial buildings and industrial settings. The recent price reductions for residential PV systems has added "smart" energy control capability and local power generation to the capability(ies) of many facilities, which increases the grid management challenges.

In a second example, energy storage facilities, which are new types of facilities that provide energy storage capabilities, have been introduced to the grids. These energy storage facilities take power from the grid when it is plentiful (and inexpensive) and store the energy in one or more forms of storage. Exemplary energy storage forms include electrical, heat, chemical (e.g. hydrogen), or potential energy (e.g. pressurized gas or gravity/mass storage). Example energy storage systems include batteries, fly wheels, and pumped storage. The energy storage facilities convert the stored energy back to electricity and sell it to the grid when power is scarce (and expensive).

New systems and methods of operation described herein address the challenges described above. The novel technology described in this document includes machine learning systems (both centralized and distributed) that are able to characterize loads and sources based upon their subtle differences in behavior and across many characterization axes. Optimization algorithms provide capabilities to electronically determine the optimizations for many thousands of users simultaneously. The described system provides these capabilities to the grid manager.

These and other aspects and advantages will become apparent when the Description below is read in conjunction with the accompanying Drawings.

6.2 Exemplary System Architecture

6.2.1 Architecture

FIG. 1 depicts a first illustration of an exemplar grid energy management/control system architecture (1000) with a grid control point (200) and an independent stochastic energy management control system (100). The grid energy management/control system architecture (1000) includes a power grid (800) to which multiple grid participants are electrically interfaced, as indicated by solid lines. Grid participants include one or more traditional, or legacy, loads (415), one or more traditional or legacy power sources (410), and multiple control points (512, 522, 532, 542, and 552). Each control point monitors and controls, on a local level, power consumption and power production functions of one or more power loads and/or power sources. For example, control point (512) provides local control for power generation system (514) and load (515). Some examples of loads and generation systems that may be under control of control point (512) are listed in Table 1. In another example, control point (522) provides local control over a photovoltaic (PV) system (524) and over an energy storage facility (525). Additional control points (532, 542, and 552) provide local control of additional loads and sources (535, 537, 539, 544, 545, 554, and 555).

The grid control point (200) is in communication with traditional grid participants (410 and 415) and with control points (512, 522, 532, 542, and 552) over a communication network (700), indicated by dotted lines. The grid control point (200) is also in communication with the stochastic energy management control system (100) over the same communication network (700) or over a dedicated communication link.

In some embodiments, not shown, the grid control point and stochastic energy management control system are a single entity. In some embodiments, the stochastic energy management control system (100) communicates with control points and/or traditional grid participants over communication network (700). In other embodiments, the stochastic energy management control system communicates with the grid control point (200) which may relay information to grid participants and communicate information regarding grid participants to the stochastic energy management system.

A second example grid energy management/control system architecture (1100) is depicted in FIG. 2. Grid control point (200) includes grid resource manager (210) and grid controller (220). Grid controller (220) includes control program (225). A first locally controlled energy management system (510) includes control point (512), generation system (514), and load (515). A second locally controlled energy management system (520) includes PV system (524) and energy storage facility (525). Grid controller (220) is in communication with each of traditional source (410), traditional load (415), and control points (512 and 522). It is understood that the grid management/control system architecture (1100) can include more or fewer of each of traditional sources, traditional loads, control points, and loads and sources controlled by control points without departing from the technology described herein. As illustrated in FIG. 1, each traditional source (e.g., 410), traditional load (e.g., 415), and managed load (e.g., 515) and managed source (e.g., 524) is electrically connectable to an electrical grid (not shown in FIG. 2).

The grid energy management/control system (1100) comprises a grid controller (220), a grid resource manager (210), and a stochastic energy management control system (100). The stochastic energy management control system (SEMCS) includes a SEMCS controller (110), a stochastic management subsystem (115), a data collection subsystem (120), and one or more databases (132, 134). The stochastic energy management control system (SEMCS) may be implemented as a stand-alone energy management system, as a unitary or distributed grid resource controller, or integrated as an additional module into an existing grid energy management/control system.

6.2.1.1 Grid Controller (220)

The grid controller (220) is a dedicated controller or server that may be independent or implemented as part of the grid control point (200) or as part of the SEMCS (100). The grid controller is connected with each of the grid participant's control points (512, 522) using at least one communication network (700). The grid controller comprises a control program (225) that generates and transmits power usage and generation control instructions from the controller to the control points and to traditional loads and sources, and receives instruction responses, usage and generation data, and historical/usage profile data from control points. Typically, the transmitted instructions, responses, and received data are stored in one or more databases of the stochastic energy management control system. In an exemplary embodiment, the grid controller (220) writes instructions, responses, usage data, generation data, and historical/usage profile data to the instructions and received data database (132).

6.2.1.2 Control Points (512, 522)

Control points (e.g. 512, 522) comprise smart building controllers, generation asset controllers, controllers associated with industrial use, and the like. Each control point manages one or more aspects of electrical usage, generation, and/or electrical energy storage. Each control point can receive instructions from, and report its energy actions, energy use, and generation to, one or more of the grid controller (220) and the SEMCS controller (110). Control points maintain and report information regarding the state of the assets they control (e.g. 514, 515), such as battery charge state, load and generation capacity (nameplate and actual given the conditions), current operating state, and similar information.

6.2.1.3 Data Collection Subsystem (120)

The data collection subsystem (120) operates to collect and make available external information about the operating environment of the electrical grid being managed. This external information is used by the stochastic energy management control system in its calculations. For example, the data collection subsystem may collect, from a weather data source (610), and store current, past, and projected weather information (e.g. temperature, wind direction/velocity, rainfall) for one or more locations associated with at least an aspect of the grid. The SEMCS controller (110) may use this external information to model and categorize a control point's behavior. In addition, the historical, current, and projected pricing for power on the grid may be collected from a power pricing and data source (514) by the data collection subsystem and provided to the SEMCS controller (110). The data collection subsystem can collect other information from one or more data sources, including from additional data source(s) (614). The other information can include, for example, grid imbalance information, interconnection energy flows, system demand and generation actuals, etc.

6.2.1.4 SEMCS Controller (110)

The SEMCS controller (110) is in operative communication with one or more control points (512, 522), and operates on behalf of the grid resource manager (210). In a first exemplary embodiment, the SEMCS controller collects information corresponding to locally managed loads and sources (i.e. loads and sources that are managed by one or more control points) directly from the control points. In a second exemplary embodiment, the grid controller (220) collects, from the control points, information corresponding to the locally managed loads and sources and provides the information to the SEMCS controller.

In an example, a smart meter associated with or comprising a grid controller collects information corresponding to a load, for example load development data. In a third, hybrid reporting, embodiment, some control points report information corresponding to locally controlled loads to the grid controller while other control points report the information directly to the SEMCS controller. The collected information includes, for example, current, actual, and historical usage/generation information corresponding to locally controlled loads and sources.

The SEMCS controller is also aware of legacy and traditional loads (415) and generation sources (410) that are connected to the grid but are not managed or characterized by the SEMCS controller, nor controlled by a control point. In an exemplary embodiment, the grid controller (220) collects information corresponding to traditional loads and sources and stores the collected information in a database of non-managed grid participants (134). The SEMCS controller (110) is operably connected to a database of non-managed grid participants (134) and can receive, from the database, information corresponding to traditional loads and sources. In another exemplary embodiment, one or more traditional loads and/or sources communicates directly with the SEMCS controller and the SEMCS controller collects information corresponding to the one or more traditional loads and/or sources. The information collected by the grid controller and/or SEMCS controller includes, for example, current, actual, and historical usage/generation information on the basis of historically metered utilization of traditional loads and sources.

Each traditional load, traditional source, and control point may also provide historic usage and/or usage profile information to the grid controller and/or SEMCS controller on a periodic or asynchronous basis.

The SEMCS controller characterizes and models at least one, more than one or a subset of the grid-connected loads and generation sources, both "smart" and "legacy/traditional," in order to maintain grid equilibrium and to optimize the generation to and use of power from, the grid. The SEMCS controller may communicate results of characterization and modelling to the grid resource manager (210). The grid resource manager and/or grid controller use the results of characterization and modelling to determine control commands to be communicated, by the grid controller, to one or more control points and/or traditional loads and sources. In an additional exemplary embodiment, the SEMCS controller may communicate directly with one or more control points to inform the one or more control points of local optimizations that the control points may undertake in order to further optimize the control points' interaction with the grid.

6.2.1.4.1 Model Input Generator (140)

The SEMCS controller (110) includes a model input generator (140) that generates computational model inputs, for example features and feature vectors, based at least in part upon one or more of information collected from control points (e.g., 512, 522), information collected from external sources (610, 612, 614) by the data collection subsystem (120), and in some embodiments information collected from traditional sources (410) and/or traditional loads (415). The model input generator provides the computational model inputs to the stochastic management subsystem (115).

6.2.1.4.2 Stochastic Management Subsystem (115)

The SEMCS controller (110) includes stochastic energy management subsystem (115). The stochastic management subsystem (115) includes a set of software programs (117) operated on the SEMCS controller (110) that include one or more computational models; for example one or more machine learning models, that model and optimize grid utilizations, and that perform predictive analysis activities on grid operation data. The stochastic energy management subsystem receives computational model inputs, for example features and feature vectors, from the model input generator (140). The stochastic energy management subsystem operates one or more computational models on the features and feature vectors to generate model outputs. The model outputs can include, for example, categorization and prediction of the behaviors of one or more control points and the resources they control, and utilization/generation predictions regarding one or more traditional sources and loads. Predicted behaviors can include, for example, predicted energy output or consumption of one or more sources or loads, predicted compliance by one or more control points with instructions sent by the SEMCS controller or grid manager, and predicted time for one or more control points to implement instructions that they receive from the SEMCS controller.

The model outputs are used by the grid controller (220) to generate one or more instructions for grid participants that are configured to optimize, by at least one measure, overall grid energy generation or usage. For example, in some embodiments the grid controller determines an optimization plan to mitigate monitored or forecast energy surpluses or deficiencies and generates instructions for one or more control points that, when carried out by the one or more control points, will cause the one or more grid participants to implement the optimization plan. The grid controller (220) communicates the one or more instructions to one or more control points.

The grid controller selects one or more control points for instruction on the basis of at least one of the following control point attributes:

Capacity,
Time since last instruction,
Time since last status communication,
Compliance (percent or ratio),
Performance response time and performance curve (how long it takes to change usage or generation),
Current status of the control point,
Geographical location.

One aspect of the stochastic management subsystem (115) is that it monitors subsequent actions by the instructed control points to determine "compliance" of the control point, e.g. whether the control point caused a change in energy usage or generation in response to instructions received from the grid controller (220), and if so, the magnitude of the resulting change and, in some cases, a time between when the instructions were sent and the resulting change was observed. In an exemplary embodiment, the grid controller records instructions sent to control points in the instructions and received data database (132).

Subsequent to communicating the instructions to one or more control points, the grid controller receives communications from the one or more control points that include at least an indication of any changes to operational parameters of loads and/or sources managed by each control point. The grid controller records these changes, and when they occurred, in the instructions and received data database (132). The SEMCS controller (110) accesses the information in database (132). This allows the stochastic management subsystem (115) to further classify each control point on the basis of its level and speed of compliance and to calculate one more metrics or sets of metrics associated with compliance (e.g. a compliance % or ratio, either static or under specific conditions), which in turn, allows for more effective balancing of the grid usage and generation by the grid controller. Note that the control point may have differing compliance % under differing conditions, e.g. a smart home controller may have 100% compliance during the day between 9a-5p and have only 65% compliance on the weekends. Ongoing monitoring of control point compliance also allows the grid controller to take further actions if the desired adjustments are not performed by one or more control points, and to take additional grid control actions to compensate for the non-compliance.

The stochastic management subsystem (115) may be implemented as a stand-alone subsystem on a single server (e.g., on SEMCS controller (110)), or may be implemented as a distributed system across a plurality of SEMCS s and/or control points (e.g., 512, 522). The machine learning aspects of the stochastic management subsystem are used for the classification of control points (as described above) and for the prediction of demand and load. These machine learning aspects may be implemented either as a centralized system, as a fully distributed machine learning system, or as a hybrid system where parts of the data collection and machine learning are performed at a central computer, and parts are performed on the distributed control points.

6.2.1.4.3 Forecasting System/Forecast Models

The programs (117) operated by the stochastic management subsystem (115) further include a forecasting system. The forecasting system manages one or more energy demand and load forecast models. The demand and load forecast models can include models to forecast one or more of grid, microgrid, control point, traditional load, and traditional source energy demand and/or load. Each model divides the demand/load forecast into a plurality of time periods (e.g. 5 minute, 15 minutes, 1 hour). Differing time periods may be used in each of the models. The forecast models may also include information from the data collection subsystem (e.g. forecast and current weather, grid pricing data, grid energy flow data) and from control point attributes defined below.

The demand/load forecasts for each control point, and the grid as a whole, is constructed using an ensemble of the plurality of models (static, trained machine learning, or a combination of both types), weighted in accordance with one or more weighting factors chosen from:

Most accurate (for specific conditions),
Best fit to conditions,
Most accurate.

Weightings by model may be established a-priori or may be determined by the stochastic management subsystem on the basis of past performance of each model under current or projected future conditions.

6.2.2 Stochastic Energy Management Control System (SEMCS) Controller (300)

Figure 3:
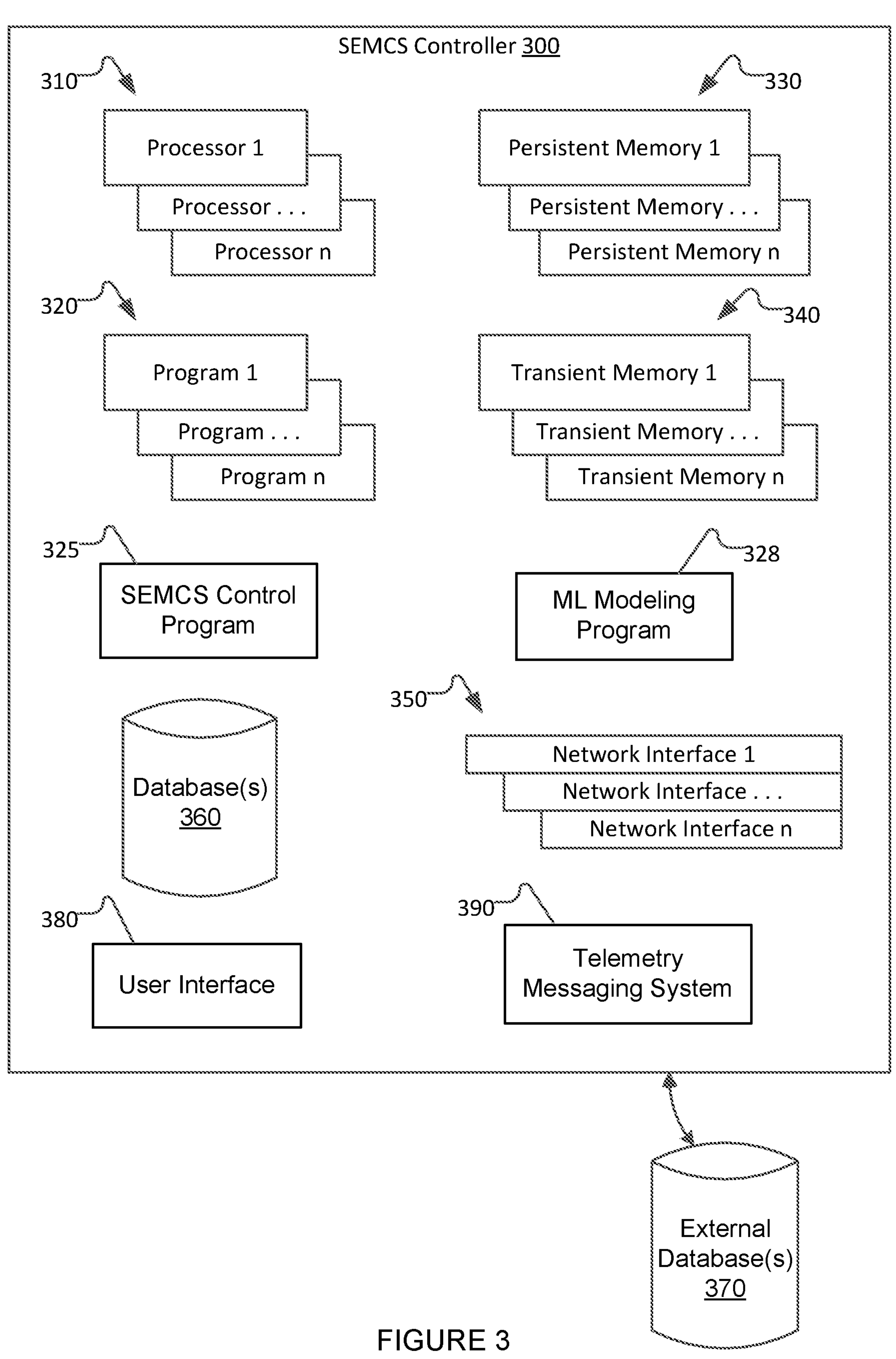
FIG. 3 depicts an energy management control system (SEMCS) controller of the technology.

FIG. 3 depicts an example controller (300) of a Stochastic Energy Management Control System (SEMCS) (as depicted in FIG. 2 as (110)). Each example SEMCS controller (300) can include one or more processors (310) (either general purpose CPUs and/or specialized processors such as FPGA, GPU, ASIC, etc.), operably connected to persistent (330) and/or transient (340) memories. The transient and/or persistent memories are used to store information being processed by the system and/or to store various program instructions (collectively programs) (320) that can be loaded and executed by the processor(s) (310) in order to perform the SEMCS controller operations described herein. The processors and memories are further operably connected to one or more networking and communications interfaces (350) appropriate to the deployed configuration. An optional user interface (380) can be used to interact with and issue instructions to the SEMCS controller. A telemetry messaging system (390) comprises an optional means for the SEMCS controller to send messages and/or telemetry measurements to other parts of the network.

Persistent memories (330) can include disk, PROM, EEPROM, flash storage, and related technologies characterized by their ability to retain their contents between on/off power cycling of the system. Some persistent memories can take the form of a file system for the SEMCS controller and can be used to store control and operating programs and information that define the manner in which the SEMCS controller operates, including scheduling of background and foreground processes, as well as periodically performed or event-driven processes. Persistent memories in the form of network attached storage (storage that is accessible over a network interface) also can be used without departing from the scope of the disclosure.

Transient memories (340) can include RAM and related technologies characterized by the contents of the storage not being retained between on/off power cycling of the system.

The network interfaces (350) are operated under control of the processor(s) and the processing instructions contained within the control and operating programs mentioned below. These interfaces provide a connection to wired and wireless networking products that operably connect the SEMCS controller(s), data sources, and network services described herein. One or more network interface(s) can be connected to ethernet-based networks (either wired or wireless), specialty networks such as a CANbus network, or can be connected using specialized wireless technologies (such as zigbee or z-wave). For purposes of clarity, each network interface (350) is illustrated as a separate interface, but can be implemented as one or more interfaces if desired.

The SEMCS controller can have an optional user interface (380), which can be a local or remote display. The user display can comprise, for example, one or more of an LCD panel, LEDs, a small OLED screen, or any other means of displaying information to the user. The user interface also can have optional user controls, which can comprise for example buttons, switches, dials, movement detectors, voice recognition, user input using a specific program (app), or similar. In some instances, the user interface is a web server interface.

One or more databases (360) can be stored within persistent memories of the system. The one or more databases (360) are used for the storage of information collected by the SEMCS controller and read, processed, and written by the processors (310) under control of the program(s) (320). The SEMCS controller also can be operably connected to an external database (370) via one or more network interfaces. Database (370) can be an instance of (360) that is provided on another server or can be a network connected database that is a commercial source (not shown). Databases (360) or (370) can be optional instances of a database used by one or more of the programs, such as databases (132) and (134) from FIG. 2.

One or more databases are stored within at least one persistent memory of the system and are considered as logical parts of system database (360) described above. These databases can include local file storage, where the file system includes the data storage and indexing scheme, a relational database (such as those produced commercially by the Oracle Corporation, or MySQL), an object database, an object relational database, a NOSQL database (such as commercially provided MangoDB), or other database structures such as indexed record structures. The databases can be stored solely within a single persistent memory, or can be stored across one or more persistent memories, or can even be stored in persistent memories on different computers.

Programs (320) supported by the SEMCS controller can include:

A SEMCS control program (325), which can be a stand-alone program or an operating system (OS) like Linux. The control program executes a plurality of other programs to carry out the various functions of the controller. In the SEMCS, the control program can be an instance of the grid control program (225) that is included in an embodiment of the SEMCS controller.

A machine learning (ML) modeling program (328), including the model input generator (140) and modeling, optimization, and prediction/forecasting programs (117) from FIG. 2.

One or more programs for providing SEMCS controller management information utilizing a web services interface or other dedicated management information reporting systems such as SNMP for purposes of providing management information useful to report on the operation of the SEMCS controller.

One or more message notification and alerting program (s), which facilitate inter-process and inter-controller messaging and notification. Examples of these programs include operating system provided inter-process communication facilities (IPCs) and third party messaging middleware subsystems such as MQ from IBM. The SEMCS controller also can include scheduling programs, such as "cron" on Unix systems or scheduled tasks on Windows systems, that are used to run specific programs on a periodic or scheduled basis.

The SEMCS controller also supports an optional telemetry messaging system (390) which is a program that can be used to send messages and/or telemetry measurements from devices connected to the network to other parts of the network. In the SEMCS, the telemetry messaging system can take the form of the data collection subsystem (120) of FIG. 2 or can be a component of the SEMCS controller (110). The messaging system optionally can use an IoT message broker protocol such as RabbitMQ, EMQ X, and VerneMQ. Devices on the network take measurements using sensors and report them to the controller, where they optionally can be placed into a channel of the telemetry messaging system and sent to a server. Other devices on the network can subscribe to that channel and receive messages whenever the measurements in that channel are updated and published by the server. Messages persist until all subscribers have seen them before they are deleted; alternately, messages are on a timer and are deleted after a certain amount of time passes.

In various embodiments, the SEMCS controller (110) may comprise part of a grid controller server, part of a piece of embedded hardware and/or software modules on another device, or as a separate system in communication with the grid controller server.

6.3 Processes of the Technology

6.3.1 Training and Updating Trained Models (Consolidated and Distributed)

The distributed machine learning aspects of the system may utilize information collected and stored in one or more databases (e.g., 120, 132, 134) of the stochastic energy management control system (as described above) and/or may use information collected and maintained within one or more control points. The information may include, for example:

- Past predictions of control point performance (accuracy),
- Past instructions (and compliance),
- Price signal sensitivity,
- Capacity (load and/or generation) status,
- Past load and generation information (e.g. how much power was used or generated),
- Past external event information (e.g. seasonality, temperature, insol),
- External events (actual and forecast, e.g. weather related such as temperature, insol, as above).

In an embodiment of a stochastic energy management control system that is at least in part implemented as a distributed system across a plurality of control points, the control points use this information to produce updated classification and forecasting trained models on a periodic basis. These models are distributed to the control points by the stochastic energy management control system and are locally trained using a combination of one or more of distributed and local data sets appropriate for each specific control point. Once the model(s) are locally trained, a control point "pushes" updated trained models to one or more systems having stochastic management system components. The training/retraining and trained model distribution process may be performed once or a plurality of times, where each of the plurality of times occurs at one of:

A regularly scheduled interval,

Upon receipt of a specific datum,

Upon identification that predictions of data and/or events are no longer in good correlation with currently collected data and/or events.

In an alternative implementation, the stochastic energy management control system components train the models using collected data from a database, and then distribute the trained model to one or more control points for use.

6.3.2 Predictions and Distributed Predictions

One or more control points and/or stochastic energy management control system components use the trained model(s) to produce predications and cause these predictions to be shared or pushed to other control points and/or stochastic energy management control system components (either distributed or consolidated). The predictions may include specific factors, such as current conditions, and include predictions for:

Likelihood of a control point complying with one or more instructions distributed by the stochastic energy management control system, Future grid generation availability, Future grid load requirements, Future grid imbalance conditions, Attainable compliance ratio for a set of energy load/source control points, Aggregate load/generation for a set of control points, Load required for a specific control point, Generation produced for a specific control point, Load/Generation response curve (by control point and in aggregate), Forecast grid pricing, Control point resource state, Control point future status.

6.3.3 First Example Operating Method

Figure 4:
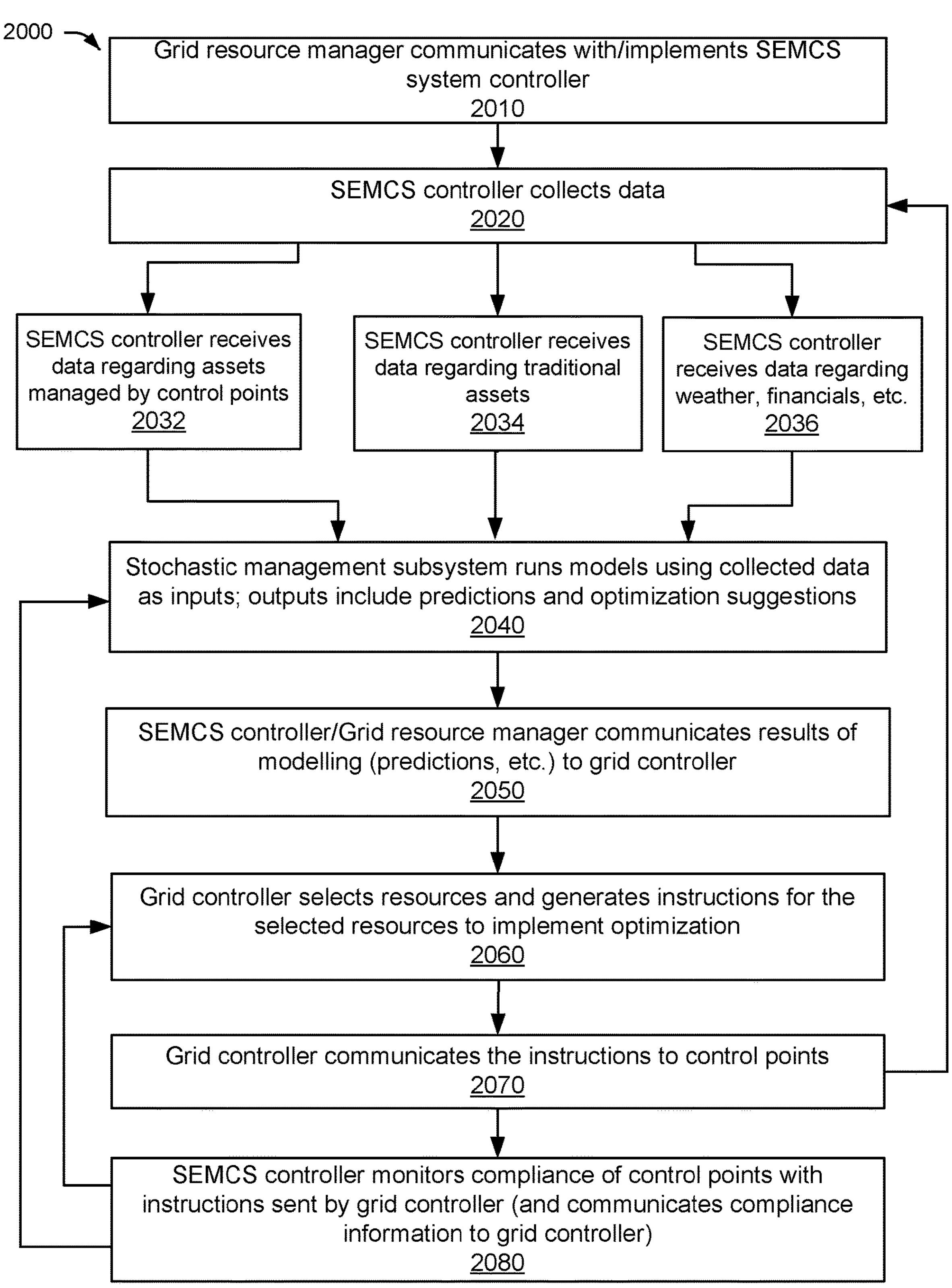
FIG. 4 illustrates a process flow depicting an example operating method (2000) that may be implemented by grid energy management/control system architecture (1100).

FIG. 4 illustrates a process flow depicting an example operating method (2000) that may be implemented by grid energy management/control system architecture (1100). At step (2010) a grid resource manager (210) initiates method (2000) by communicating with a separate SEMCS controller (110) or by initiating operation of a SEMCS controller that is co-located with the grid controller; for example a SEMCS controller that is hosted on a same system as the grid controller or that is a component of the grid controller.

At step (2020) the SEMCS controller collects or otherwise receives information from one or more sources. In examples, the SEMCS controller receives information regarding assets managed by one or more control points at step (2032). The SEMCS controller can receive the information directly from one or more control points that it is in communication with or from instructions and received data database (132). This information can include, for example, current load or supply corresponding to a managed asset and responses of one or more assets to control signals. The SEMCS controller can receive, at step (2034), information regarding traditional assets. In an exemplary embodiment, the SEMCS controller retrieves information regarding traditional assets from the database of non-managed grid participants (134). At step (2036), the SEMCS controller receives information collected by the data collection subsystem (120) from one or more external data sources; for example from weather data source (610).

At step (2040) the model input generator (140) generates inputs; for example, features or feature vectors, useful for operating against one or more ML models of the stochastic management subsystem (115), which uses the inputs to operate one or more computation models; for example, forecasting, prediction, and/or optimization models, to generate model output data. At step (2050) the SEMCS controller, or the grid resource manager, communicates model output data to the grid controller (220).

At step (2060) the grid controller (220) selects grid resources, for example one or more loads and/or sources associated with one or more control points and generates one or more instructions for the selected grid resources based at least upon the information communicated to the grid controller in step (2050). These instructions include, for example, operating parameters that are configured to, if implemented by the grid resources, optimize one or more aspects of energy consumption and generation on a grid or microgrid associated with the grid controller.

At step (2070) the grid controller communicates instructions to one or more control points. Method (2000) then branches with the SEMCS controller (110) continuing to collect data at step (2020) while, at step (2080) also monitoring compliance of grid resources with instructions sent by the grid controller. In some implementations, the SEMCS controller may return to step (2060) to deselect previously selected grid resources, select new grid resources, make changes to instructions for selected grid resources, and/or generate new instructions for selected grid resources based at least upon the results of compliance monitoring performed at step (2080).

The grid energy management/control system architecture (1100) can continue to operate method (2000) as long as the grid is operational and/or may restart method (2000) periodically or in response to one or more conditions.

6.3.4 Second Example Operating Method (Energy Surplus or Deficiency Management)

Figure 5:
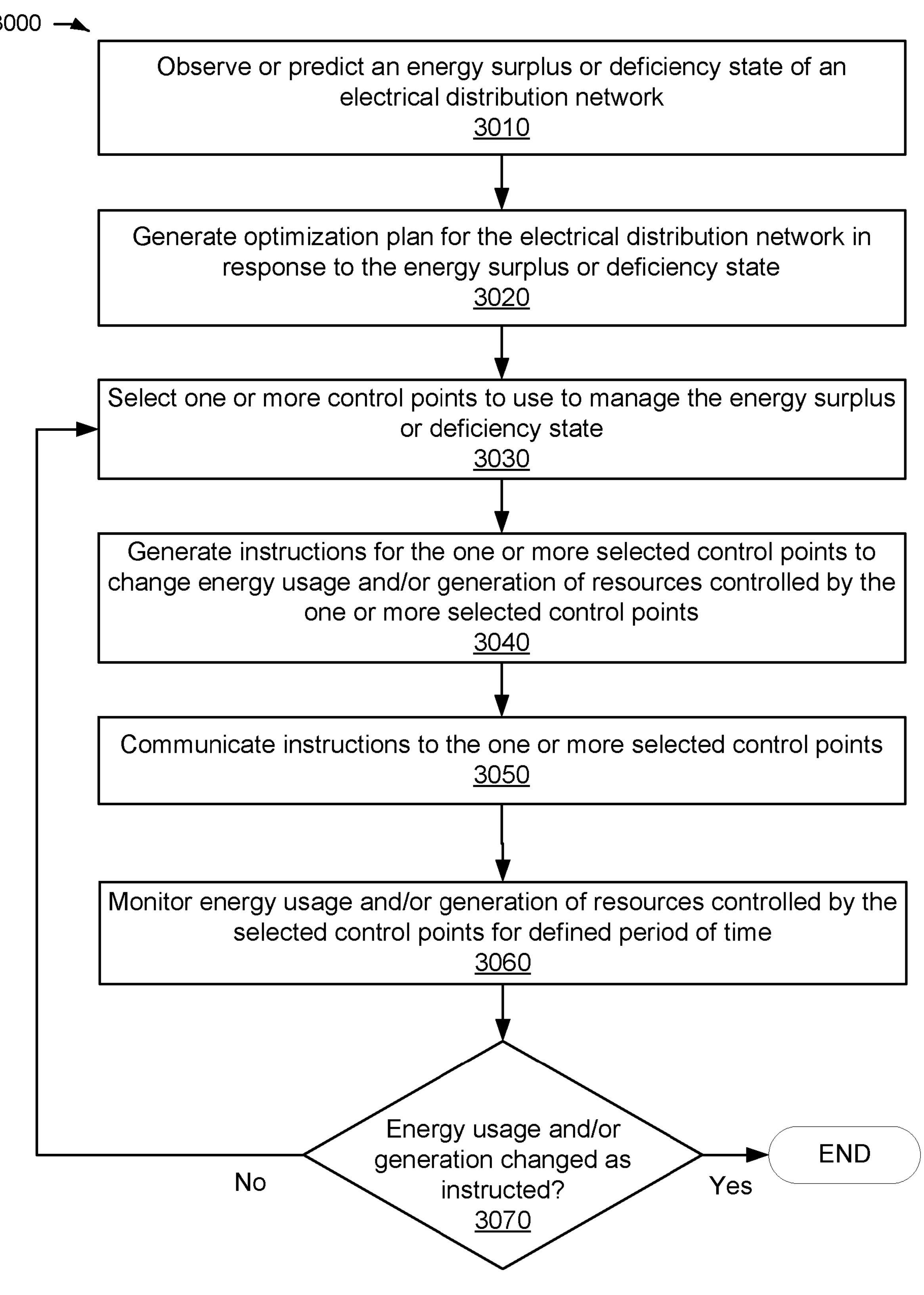
FIG. 5 illustrates a process flow depicting an example operating method (3000) that may be implemented by grid energy management/control system architecture (1100).

FIG. 5 illustrates a process flow depicting an example operating method (3000) that may be implemented by grid energy management/control system architecture (1100) and, in particular in some embodiments, by a grid controller (220) including a SEMCS controller (110) operating on behalf of the grid controller. The grid controller monitors the energy state of an electrical distribution network which may include an electrical grid or microgrid including one or more locally controlled energy management systems (e.g., 510, 520), each of which includes a control point comprising an electrical controller, i.e. a controller that manages consumption or generation of electrical power by grid resources managed by the control point.

At step (3010) the grid controller observes or predicts an energy surplus or deficiency state of the electrical distribution network. For example, the grid controller may collect data regarding current operating states of electrical loads and sources that are electrically interfaced with the electrical distribution network and recognize a current energy deficiency or surplus. Alternatively or additionally, the grid controller may communicate the collected data to stochastic energy management subsystem (115), and receive, from the stochastic energy management subsystem, one or more predicted future states of the electrical distribution network that include a surplus or deficiency of electrical energy one the electrical distribution network.

At step (3020), the grid controller generates an optimization plan for the electrical distribution network in response to the observed or predicted energy surplus or deficiency state. The optimization plan can include paired optimization, wherein goals corresponding to each of the one or more locally controlled energy management systems and goals corresponding to the overall electrical distribution network are used as inputs for generating the optimization plan.

At step (3030), the grid controller selects one or more control points, and grid resources (loads and/or sources) controlled by the one or more control points, for use in managing the energy surplus or deficiency state. In an example, in response to an observed or predicted energy deficiency, the grid controller selects one or more sources to provide additional power and/or one or more loads to reduce power consumption to manage the energy deficiency. The grid controller selects control points associated with the selected sources and/or loads for use in managing the energy deficiency. At step (3040), the grid controller generates instructions for the selected control points, including instructions for changes to operational states of one or more selected resources (loads and/or sources) associated with the selected control points. At step (3050) the grid controller communicates the instructions to the selected control points.

At step (3060) the grid controller monitors the energy usage and/or generation of the resources controlled by the selected control points. At step (3070) the grid controller determines compliance of the selected resources with the instructions. Compliance includes whether energy usage and/or generation of selected resources has changed as instructed, i.e. whether the selected loads and/or sources have adjusted electrical consumption or production as instructed by the grid controller. In some embodiments, the grid controller monitors the energy usage and/or generation for a set period of time at step (3060) before making the compliance determination at step (3070). In examples, the grid controller monitors energy usage and/or generation for 5 minutes or less, for 15 minutes or less, or for 1 hour or less prior to making the compliance decision.

If the grid controller determines, at step (3070), that one or more the selected loads and/or sources have not adjusted electrical consumption or production as instructed, the grid controller may return to step (3030) to select one or more additional or different control points, and corresponding loads and/or sources, to manage the energy surplus or deficiency state. Otherwise, method (3000) may end or return to step (3010) wherein the grid controller continues to monitor the electrical distribution system.

6.3.5 Third Example Operating Method (Global Optimization)

Figure 6:
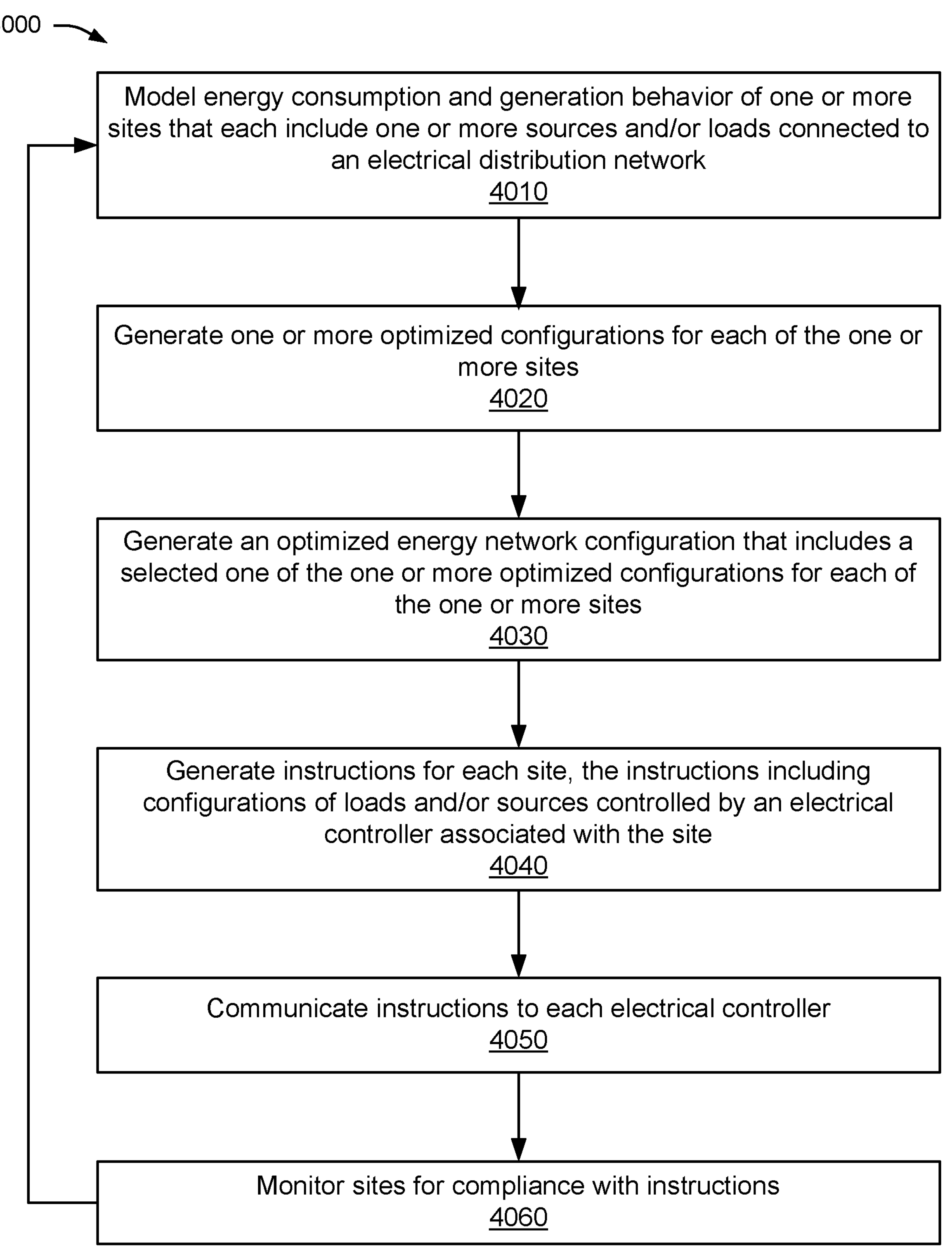
FIG. 6 illustrates a process flow depicting an example operating method (4000) that may be implemented by grid energy management/control system architecture (1100).

FIG. 6 illustrates a process flow depicting an example operating method (4000) that may be implemented by grid energy management/control system architecture (1100).

At step (4010) a SEMCS controller (110) runs one or more trained machine learning models against collected data corresponding to an electrical distribution network to generate predictions of energy consumption and generation at one or more sites that each include at least one locally controlled energy management system.

At step (4020), the SEMCS controller, or a grid controller in communication with or comprising the SEMCS controller, generates one or more optimized configurations for each of the one or more sites. Each optimized configuration includes energy generation and/or consumption levels for a particular site that optimize one or more criteria for the particular site in relation to an energy state of the electrical distribution network at a current or future time. For example, and referring to FIG. 2, an optimized configuration for a site including locally controlled energy management system (520) may include energy storage facility (525) providing energy to the electrical distribution network when the price of energy is predicted to be high, thereby optimizing a payment amount to local energy management system (520) for the energy provided. The SEMCS controller may generate multiple optimized configurations for each site, for example a primary, most highly optimized, configuration and a secondary, less optimal, configuration.

At step (4030), the grid controller generates an optimized energy network configuration. In an example, the grid controller selects a combination of optimized site configurations that makes up an optimized configuration for the overall energy network. To do so, the grid controller may model network performance given one or more combinations of individual site configurations and select a combination that provides the best predicted network performance. In an example, the grid controller may weight selection of individual site configurations to favor more optimal configurations for each site. However, the grid controller may select a combination of site configurations that includes one or more less optimized site configuration(s) if predicted network performance is better optimized with such selection.

At step (4040) the grid controller generates instructions for each site that include instructions for an electrical controller (i.e. control point) associated with each site for configurations of loads and sources controlled by the electrical controller to implement the optimized energy network configuration. At step (4050), the grid controller communicates the instructions to each electrical controller.

At step (4060), the grid controller monitors sites for compliance with the instructions that were communicated to the electrical controllers at step (4050) and may return to step (4010) to begin another iteration of process (4000). If the grid controller determines, at step (4060) that one or more sites have not complied with instructions, the grid controller may return to either step (4020) or step (4030) and may generate an altered optimized network configuration that includes one or more additional or different optimized site configurations.

6.3.6 Fourth Example Operating Method (Compliance Prediction)

Figure 7:
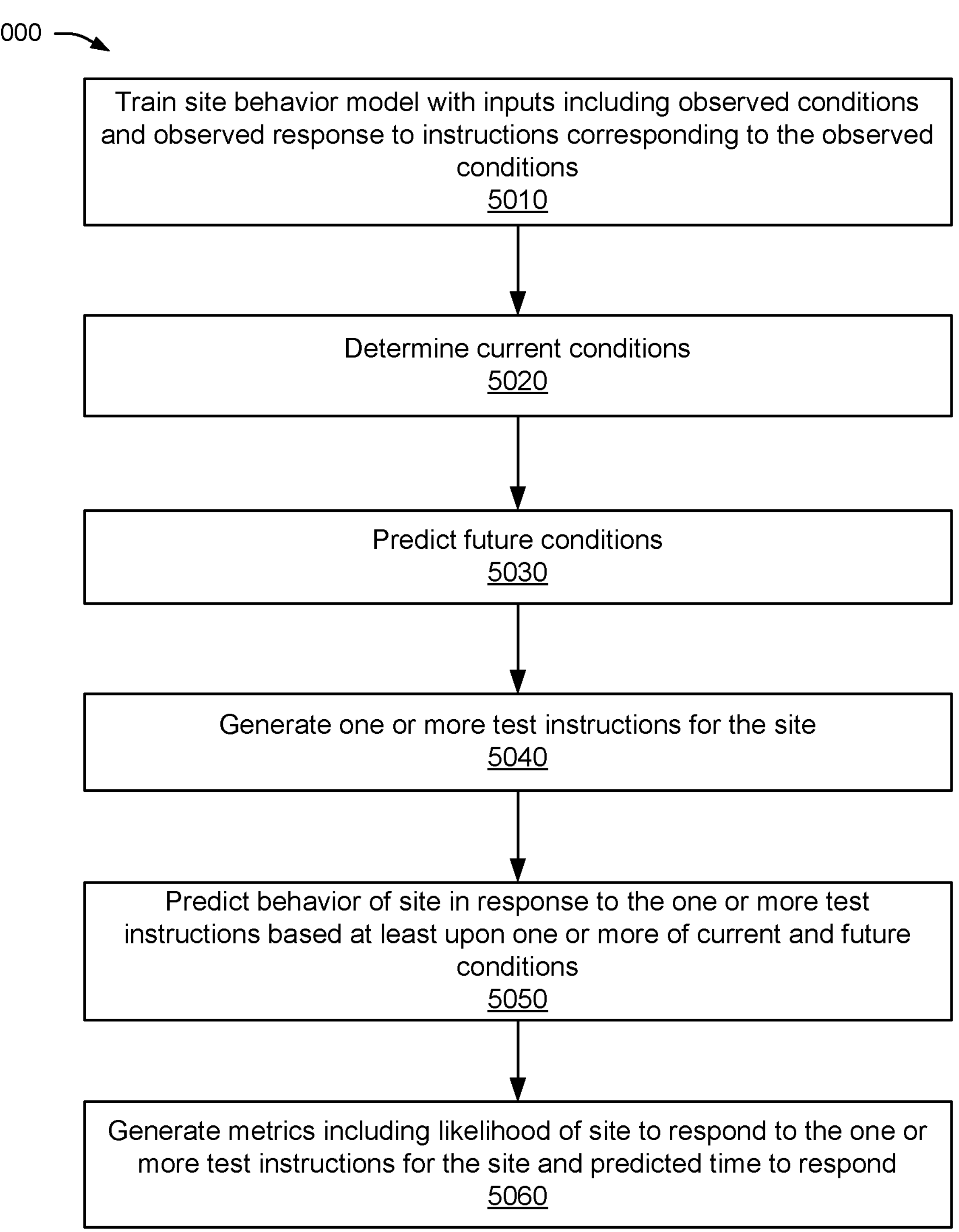
FIG. 7 illustrates a process flow depicting an example operating method (5000) that may be implemented by grid energy management/control system architecture (1100).

FIG. 7 illustrates a process flow depicting an example operating method (5000) that may be implemented by grid energy management/control system architecture (1100).

At step (5010), the SEMCS controller (110) trains one or more site behavior models that are useful for predicting the behavior of a site, e.g., a locally controlled energy management system that is electrically connected to an electrical distribution network. The SEMCS trains the one or more site behavior models with inputs that include observed conditions and observed responses, by the site, to instructions provided by the same or different SEMCS controller or by a grid controller to the site. Observed responses may include, for example: absolute compliance with instructions, e.g., whether or not requested changes are implemented at all; relative compliance with instructions, e.g., percent amount of a requested increase in power production that is provided; and elapsed time between instructions being sent and observed compliance or partial compliance with the instructions.

The SEMCS controller or a grid controller monitors the electrical distribution network to determine current conditions (5020) associated with the electrical distribution network and, at step (5030) predicts future conditions of the electrical distribution network.

At step (5040), the SEMCS controller or grid controller generates one or more test instructions for the site. For example, referring to FIG. 6, the test instructions can include instructions corresponding to an optimized site and/or energy network configuration. At step (5050), the SEMCS controller operates the one or more trained site behavior models against the test instructions and the current and/or predicted conditions to generate one or more predictions of site behavior and, at step (5060) generates one or more site behavior prediction metrics based on the one or more predictions of site behavior. The one or more site prediction metrics can include, for example, a likelihood of the site to respond to the test instructions, a predicted degree of compliance with the test conditions, and a predicted elapsed time for the site to comply with the test instructions.

It will also be recognized by those skilled in the art that, while the technology has been described above in terms of preferred embodiments, it is not limited thereto. Various features and aspects of the above described technology may be used individually or jointly. Further, although the technology has been described in the context of its implementation in a particular environment, and for particular applications, those skilled in the art will recognize that its usefulness is not limited thereto and that the present technology can be beneficially utilized in any number of environments and implementations where it is desirable to do so. Accordingly, the claims set forth below should be construed in view of the full breadth and spirit of the technology as disclosed herein.

What is claimed is:

1. A system for automatically managing surplus and deficiencies on an electrical distribution or transmission network, comprising:

a computer-based grid controller, configured and operable to send information to and receive information from a connected control point, the computer-based grid controller further configured to classify the connected control point on the basis of its level and speed of compliance and to calculate one more metrics associated with compliance, and at least one computer-based electrical controller, operably connected to the computer-based grid controller, which operates the connected control point to locally train machine learning models using a combination of one or more of distributed and local data sets, the locally trained machine learning models for running against collected data corresponding to an electrical distribution or transmission network to generate predictions of energy consumption and generation at one or more sites that each include at least one locally controlled energy management system, the computer-based grid controller including at least one processor configured to perform operations comprising:

monitoring an energy surplus and deficiency state of the electrical distribution or transmission network, to predict energy surplus and deficiencies on the electrical distribution or transmission network, selecting a set of electrical controllers to manage the energy surplus and deficiencies with, and generate instructions to change energy usage/generation controlled by one or more of the at least one computer-based electrical controller, the instructions configured to cause the one or more of the at least one computer-based electrical controller(s) to either provide additional electrical energy to the electrical distribution or transmission network, or curtail electrical energy load on the electrical distribution or transmission network, monitor energy usage/generation of the one or more of the at least one computer-based electrical controller(s) to determine actual electrical energy used/generated for a defined period of time, and generate additional instructions to change the energy usage/generation controlled by the one or more of the at least one computer-based electrical controllers.

2. The system of claim 1, wherein the computer-based grid controller is further configured to predict contribution controlled by each computer-based electrical controller to the electrical distribution or transmission network.

3. The system of claim 1, wherein the computer-based grid controller is further configured to predict the compliance in response of an electrical controller to an instruction from the computer-based grid controller.

4. The system of claim 1, wherein the additional instructions are provided to a different set of electrical controllers than the originally selected set of computer-based electrical controllers.

5. The system of claim 1, wherein the additional instructions are provided to a set of computer-based electrical controllers that did not comply with initial instructions.

6. The system of claim 1, wherein the defined period of time is less than 5 minutes.

7. The system of claim 1, wherein the defined period of time is less than 15 minutes.

8. The system of claim 1, wherein the defined period of time is less than 1 hour.

9. The system of claim 1, wherein the prediction is based in part upon extrinsic weather, market data, grid data or other collected information.

10. The system of claim 1, wherein the prediction is based in part upon performance by one or more electrical controllers in comparison to a previous prediction.

11. The system of claim 1, wherein the computer-based grid controller is further configured to predict the compliance and find an optimal path to minimize cost of service being provided to a stabilized distribution or transmission network in response of an electrical controller to an instruction from the computer-based grid controller.

12. The system of claim 1 wherein the computer-based grid controller is further configured to provide optimal utilization of individual assets to minimize incurred cost, which provides space for lower costs of grid stabilization/resiliency.

13. A method for automatically managing surplus and deficiencies on an electrical distribution or transmission network, comprising:

sending and receiving information from a connected control point of a computer-based grid controller, and operating the connected control point, including:

monitoring an energy surplus and deficiency state of the electrical distribution or transmission network to predict the energy surplus and deficiencies on the electrical distribution or transmission network, selecting a set of computer-based electrical controllers to manage the energy surplus and deficiencies with, classifying the connected control point on the basis of its level and speed of compliance and to calculate one more metrics associated with compliance, locally train machine learning models using a combination of one or more of distributed and local data sets, and running the locally trained machine learning models against collected data corresponding to the electrical distribution or transmission network to generate predictions of energy consumption and generation at one or more sites that each include at least one locally controlled energy management system, and generating instructions to change energy usage/generation controlled by one or more computer-based electrical controllers, the instructions configured to cause the one or more computer-based electrical controllers to either provide additional electrical energy to the distribution or transmission network, or curtail electrical energy load on the distribution or transmission network, monitor the energy usage/generation of the instructed one or more computer-based electrical controller(s) to determine actual electrical energy used/generated for a defined period of time, and generate additional instructions to change the energy usage/generation controlled by the one or more computer-based electrical controllers.

14. The method of claim 13, further including predicting contribution controlled by each computer-based electrical controller to the electrical distribution or transmission network.

15. The method of claim 13, further including predicting the compliance in response of a computer-based electrical controller to an instruction from the computer-based grid controller.

16. The method of claim 13, further including providing the additional instructions to a different set of computer-based electrical controllers than the originally selected set of computer-based electrical controllers.

17. The method of claim 13, further including providing the additional instructions to the set of computer-based electrical controllers that did not comply with initial instructions.

18. The method of claim 13, wherein the defined period of time is less than 1 hour or preferably less than 15 minutes or preferably less than 5 minutes.

19. The method of claim 13, where the prediction is based in part upon extrinsic weather, market data, grid data or other information collected by the computer-based grid controller and/or based upon performance by one or more computer-based electrical controllers in comparison to a previous prediction.

20. The method of claim 13, further including predicting the compliance and finding optimal path to minimize cost of service being provided to stabilized distribution network in response of a computer-based electrical controller to an instruction from the computer-based grid controller.

21. The method of claim 13 further including providing optimal utilization of individual assets to minimize incurred cost, and providing space for lower costs of grid stabilization/resiliency.

* * * * *